(12) United States Patent
Kapusta et al.

(10) Patent No.: US 8,115,117 B2
(45) Date of Patent: Feb. 14, 2012

(54) SYSTEM AND METHOD OF FORMING ISOLATED CONFORMAL SHIELDING AREAS

(75) Inventors: Christopher James Kapusta, Delanson, NY (US); Donald Paul Cunningham, Dallas, TX (US)

(73) Assignee: General Electric Company, Schenectady, NY (US)

( * ) Notice: Subject to any disclaimer, the term of this patent is extended or adjusted under 35 U.S.C. 154(b) by 396 days.

(21) Appl. No.: 12/488,639

(22) Filed: Jun. 22, 2009

(65) Prior Publication Data

US 2010/0319981 A1 Dec. 23, 2010

(51) Int. Cl.
*H05K 9/00* (2006.01)
(52) U.S. Cl. ....... 174/386; 174/387; 361/816; 29/592.1; 427/96.3; 427/96.4
(58) Field of Classification Search ................ 174/386, 174/387; 361/816, 818; 29/592.1; 427/96.3, 427/96.4
See application file for complete search history.

(56) References Cited

U.S. PATENT DOCUMENTS

| | | | |
|---|---|---|---|
| 4,399,487 A | 8/1983 | Neumann | |
| 5,166,864 A | 11/1992 | Chitwood et al. | |
| 5,177,324 A | 1/1993 | Carr et al. | |
| 5,557,064 A | 9/1996 | Isern-Flecha et al. | |
| 5,557,142 A | 9/1996 | Gilmore et al. | |
| 5,608,188 A * | 3/1997 | Choon et al. | 174/372 |
| 5,639,989 A | 6/1997 | Higgins, III | |
| 5,672,844 A * | 9/1997 | Persson et al. | 174/387 |
| 5,844,784 A * | 12/1998 | Moran et al. | 361/818 |
| 5,864,088 A * | 1/1999 | Sato et al. | 174/386 |
| 5,867,371 A * | 2/1999 | Denzene et al. | 361/816 |
| 5,917,708 A * | 6/1999 | Moran et al. | 361/800 |
| 6,037,846 A * | 3/2000 | Oberhammer | 333/182 |
| 7,183,498 B2 * | 2/2007 | Ogura et al. | 174/387 |
| 7,196,275 B2 | 3/2007 | Babb et al. | |
| 7,262,369 B1 * | 8/2007 | English | 174/370 |
| 7,999,196 B2 * | 8/2011 | Hsieh | 174/386 |
| 2006/0152913 A1 | 7/2006 | Richey et al. | |

* cited by examiner

*Primary Examiner* — Hung Ngo
(74) *Attorney, Agent, or Firm* — Ziolkowski Patent Solutions Group, SC; Jean K. Testa

(57) ABSTRACT

A system and method of forming a patterned conformal structure for an electrical system is disclosed. The conformal structure includes a dielectric coating positioned on an electrical system having circuit components mounted thereon, the dielectric coating shaped to conform to a surface of the electrical system and having a plurality of openings therein positioned over contact pads on the surface of the electrical system. The conformal structure also includes a conductive coating layered on the dielectric coating and on the contact pads such that an electrical connection is formed between the conductive coating and the contact pads. The dielectric coating and the conductive coating have a plurality of overlapping pathway openings formed therethrough to isolate a respective shielding area of the conformal structure over desired circuit components or groups of circuit components.

25 Claims, 6 Drawing Sheets

SYSTEM AND METHOD OF FORMING ISOLATED CONFORMAL SHIELDING AREAS

BACKGROUND OF THE INVENTION

Embodiments of the invention relate generally to conformal coatings and, more particularly, to a method and apparatus for forming a patterned conformal structure for an electrical system.

Technological advancements in the area of electronic devices have experienced vast growth in recent years. For example, while cellular phones are becoming smaller and lighter, their features and capabilities are simultaneously expanding. This has caused an increase in the complexity and operation of the electrical components found in such devices and a decrease in the amount of space available for such components. Several challenges arise from such an increase in complexity of the electrical components and decrease in the amount of space available. For example, the reduction in size of the circuit board leads to increased congestion on the circuit board.

The decreased amount of space available and increased congestion of circuit components thereon poses a challenge with respect to radio frequency and electromagnetic interference (i.e., RFI and EMI) between components. That is, many electronic components radiate electromagnetic radiation, which may cause interference with other adjacent circuit board components and detrimentally affect the performance of the overall circuit assembly. As a result, shields have been used to prevent such components from causing such interference. Shields may also be desired to segregate areas on the circuit board/circuit assembly that operate at different potentials.

The most common RFI/EMI shields are box-type shields comprised of folded or stamped metal (i.e., metal cans, metal foil claddings, etc.) contoured to fit over a PC board or over individual circuit components thereon. Space must be allocated on the circuit board to accommodate these box-type shields, which reduces the space available for other components. That is, conventional box-type shields are bulky and take up a great deal of space and volume, a majority of which is an unused air gap between the circuit board and the shield. This can add to the overall thickness of an electronic device (e.g., a cellular phone).

As an alternative to box-type shields, conformal-type shields have recently been implemented for shielding circuit assemblies and shielding individual circuit components thereon. Typically, such shields are formed of a dielectric layer and a metal layer that are disposed onto the circuit assembly. A masking layer is applied over portions of the dielectric layer before application of the metal layer, such that a "patterned" metal layer can be formed on the dielectric layer that corresponds to circuit components of the circuit assembly. Use of such a masking layer, however, has its limitations. That is, for circuit assemblies having circuit components packed very tightly thereon, application of a masking layer may not be precise enough for accurate application/formation of the patterned metal layer.

Therefore, it would be desirable to design a patterned conformal structure, and method of manufacturing thereof, that can be implemented with circuit assemblies having tightly packed circuit components. The design would thus allow for a tighter packing density of components not possible with conventional box shields. It would further be desirable to provide an efficient method for manufacturing a patterned conformal structure that can eliminate use of a masking layer when patterning the metal layer to form conformal shielding structures.

BRIEF DESCRIPTION OF THE INVENTION

Embodiments of the invention overcome the aforementioned drawbacks by providing a patterned conformal structure for an electrical system, and method of manufacturing thereof, that provides isolated shielding of tightly packed circuit board components from RF and/or EM interference.

In accordance with one aspect of the invention, a conformal structure includes a dielectric coating positioned on an electrical system having circuit components mounted thereon, the dielectric coating shaped to conform to a surface of the electrical system and having a plurality of openings therein positioned over contact pads on the surface of the electrical system. The conformal structure also includes a conductive coating layered on the dielectric coating and on the contact pads such that an electrical connection is formed between the conductive coating and the contact pads. The dielectric coating and the conductive coating have a plurality of overlapping pathway openings formed therethrough to isolate a respective shielding area of the conformal structure over desired circuit components or groups of circuit components.

In accordance with another aspect of the invention, a method of forming a patterned conformal structure includes the step of applying a conformal insulating coating to an electrical system, the electrical system including a circuit substrate and a plurality of circuit components mounted thereon. The method also includes the steps of depositing a conformal metallic layer on the insulating coating and laser ablating a plurality of pathway openings through the insulating coating and the metallic layer to segregate the conformal insulating coating and metallic layer into isolated shielding areas positioned over desired circuit components or groups of circuit components.

In accordance with yet another aspect of the invention, a method of forming a patterned conformal structure includes the steps of applying an electrically insulating coating to a circuit board having a plurality of circuit components mounted thereon and forming a contact pad opening in the electrically insulating coating adjacent to each of a plurality of contact pads on the circuit board. The method also includes the steps of depositing a conductive layer over the electrically insulating coating and in the contact pad opening adjacent to each of the plurality of contact pads and laser ablating the conductive layer and the electrically insulating coating to form an isolated conductive layer shielding area over each of a plurality of selected circuit components or group of circuit components.

These and other advantages and features will be more readily understood from the following detailed description of preferred embodiments of the invention that is provided in connection with the accompanying drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENT

Embodiments of the present invention provide a patterned conformal shielding structure. The structure is described as being conformal because it is formed to conform or adapt to the shape of the article that it is applied to. While described below with respect to use with a printed circuit board (PCB), it is envisioned that the conformal shielding structure of the invention may be used in conjunction with other electrical systems and electronic devices.

Figure 1:
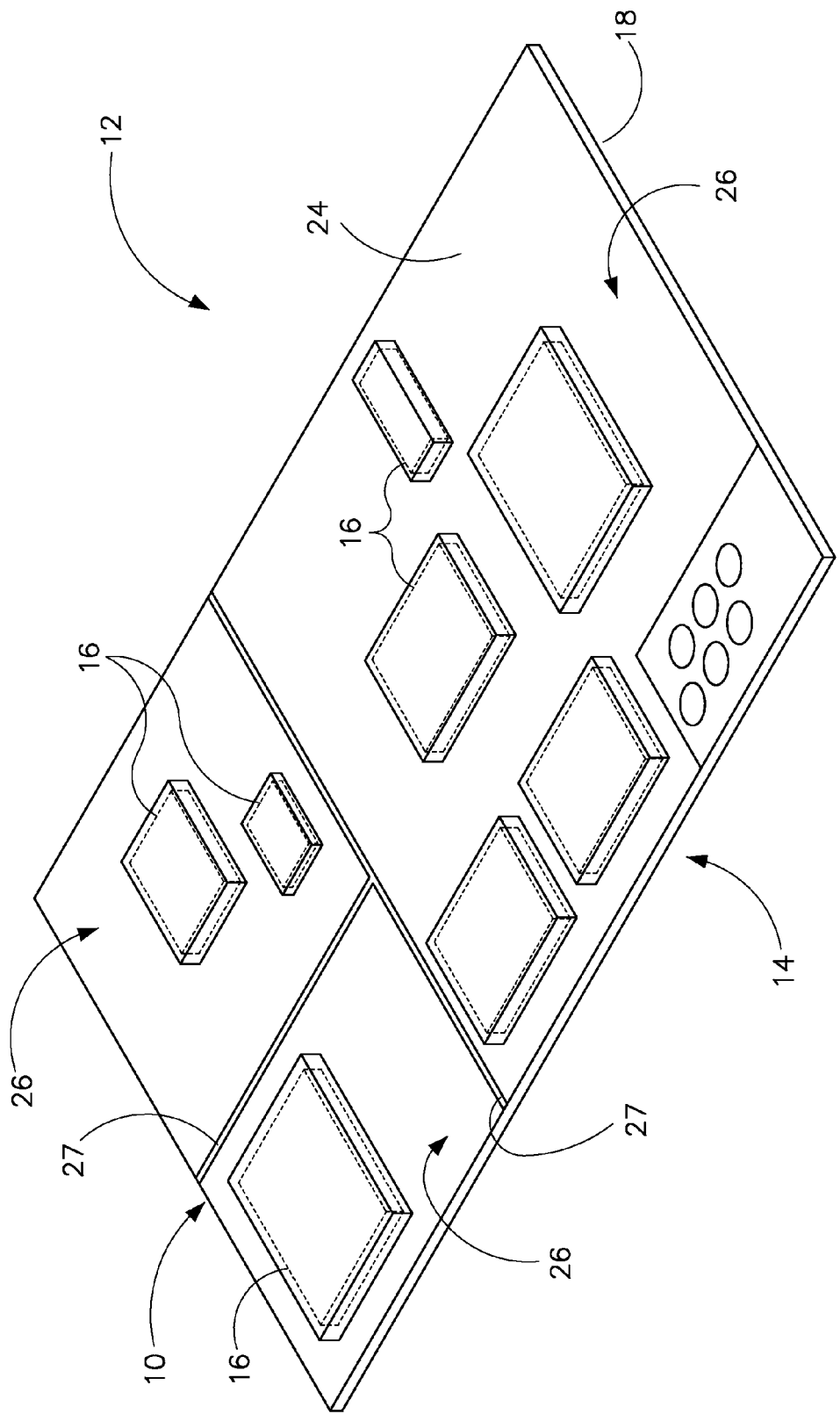
FIG. 1 is a perspective view of a patterned conformal structure formed on a populated printed circuit board according to an embodiment of the invention.

Referring to FIG. 1, a perspective view of a patterned conformal structure 10 is shown in accordance with the invention. The patterned conformal structure 10 forms part of a circuit assembly 12, together with a circuit substrate 14, such as a printed circuit board (PCB), flex PCB, rigid flex PCB, or multi-chip module, with circuit components 16 disposed on the circuit substrate 14. The patterned conformal structure 10 is disposed on the circuit substrate 14 and circuit components 16 so as to conform about the components and at least a portion of the circuit substrate. According to an embodiment of the invention, the resulting patterned conformal structure 10 provides localized shielding to circuit assembly 12 by selectively shielding individual circuit components 16 or groups of components. While described for use with a circuit substrate 14 and circuit components 16, it is also envisioned that patterned conformal structure 10 could be positioned over other electrical systems sensitive to RF and EM interference. According to another embodiment of the invention, patterned conformal structure 10 further provides interconnects for circuit assembly 12 that can function as electrical and/or thermal pathways in circuit assembly 12.

The patterned conformal structure 10 includes therein a dielectric layer 18 and a metallic layer 24 that provides protection to the circuit components 16 from internally- and externally-sourced interfering elements, as well as provides electrical and/or thermal pathways for circuit assembly 12. That is, patterned conformal structure 10 includes therein localized grounded shielding structures 26 (i.e., segregated shielding areas) that are defined/separated by laser cut pathways 27 extending through dielectric layer 18 and metallic layer 24. The shielding structures/areas 26 protect circuit components 16 from radio frequency (RF) interference, electromagnetic (EM) interference, electro-static discharge, and environmental elements such as moisture, dust, and environmental contaminants. According to embodiments of the invention, the localized grounded shielding structures 26 of patterned conformal structure 10 conform to a circuit component 16 or groups of circuit components such that each component 16 is protected and shielded from potential interference from other components 16 of the circuit assembly 12 and from outside sources. According to one embodiment of the invention, in addition to providing localized shielding to selective components 16, the patterned conformal structure 10 also includes interconnects (not shown) that can function, for example, to connect shielding areas 26 to ground or as thermal pathways for improved heat dissipation in circuit assembly 12.

Figure 2:
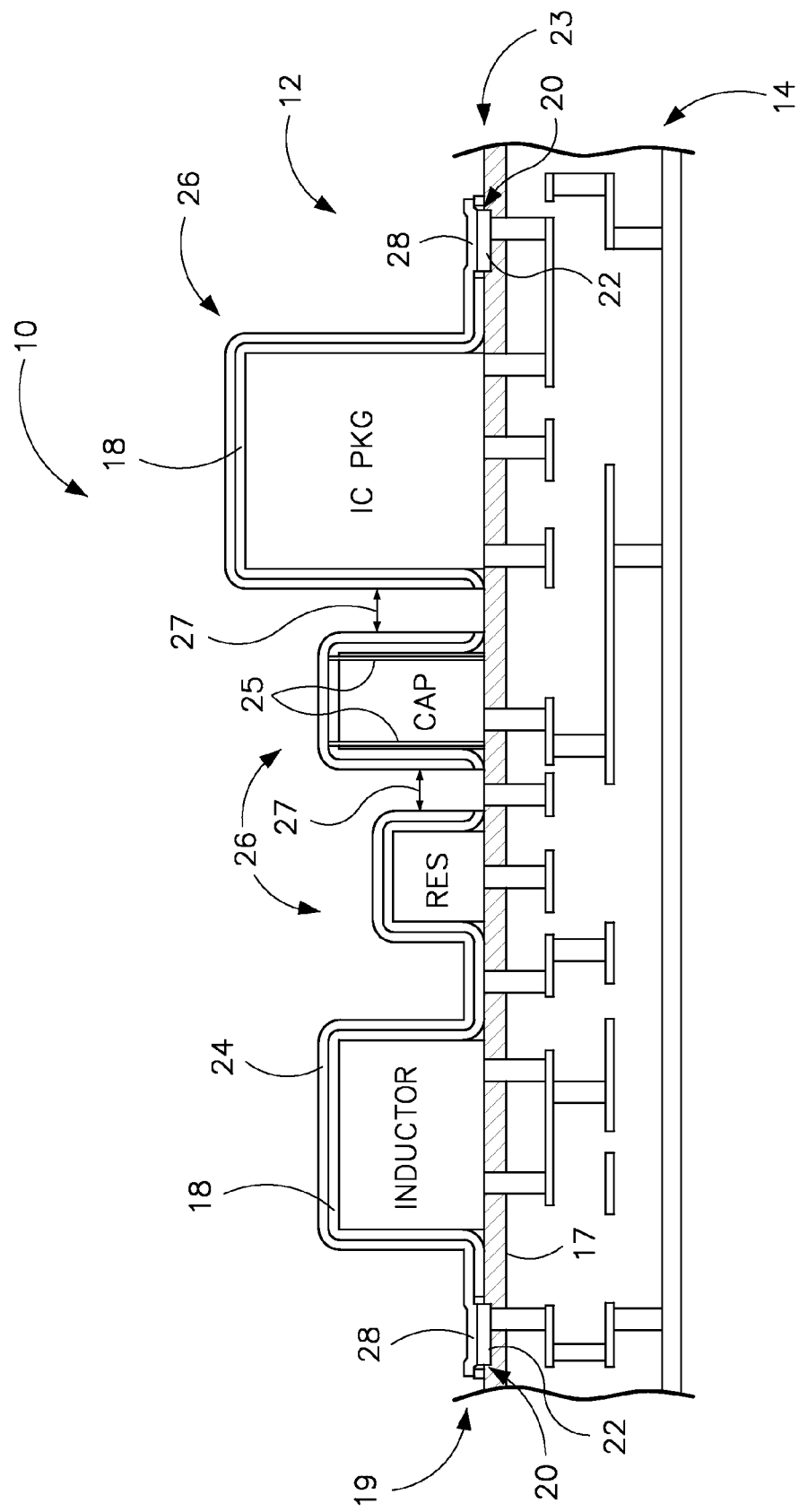
FIG. 2 is a cross-sectional view of a patterned conformal structure according to an embodiment of the invention.

Referring now to FIG. 2, a cross-sectional view of circuit assembly 12 and patterned conformal structure 10 is shown, in accordance with an embodiment of the invention. The patterned conformal structure 10 is formed from a conformable material that can be adapted to the shape of the circuit substrate 14 and the circuit components 16 (e.g., resistors, integrated circuit packages, capacitors, inductors, etc.) upon which it is disposed. According to one embodiment of the invention, a solder mask 17 is applied to a surface of circuit substrate 14. The patterned conformal structure 10 includes a dielectric layer or coating 18 (i.e., electrically insulating layer) that is positioned adjacent to and formed over a top surface 19 of circuit substrate 14 and the circuit components 16 positioned thereon. The dielectric layer 18 makes contact with the circuit components 16 so as to help protect the components and other portions of the circuitry on the circuit substrate 14 from electrical shorts. The dielectric layer 18 can be formed of any electrically insulating material that can be made to conform to the shape of the circuit assembly 12, and in one embodiment, comprises a ultraviolet (UV) curable polymer such as, for example, a UV light curing conformal coating by Dymax Corp. It is also envisioned, however, that other suitable epoxy coatings or silicon-based coatings could also be used to form dielectric layer 18. In depositing dielectric layer 18 on circuit assembly 12, a spray coating process can be employed. Such an application process provides a controllable and reproducible depositing of dielectric coating 18 on circuit assembly 12, allowing for control of the thickness of the dielectric layer. It is also envisioned, however, that a dip coating process can be used to deposit dielectric layer 18 on circuit assembly 12, or that dielectric layer 18 could be applied and shaped by way of a thermo-forming process. Importantly, the deposition of dielectric coating 18 on circuit assembly 12 via one of the above techniques results in a coating having a uniform thickness and that is pinhole-free.

According to an embodiment of the invention, a plurality of openings 20 are formed in dielectric coating 18 to expose contact pads 22 located on circuit substrate 14 and, according to one embodiment, expose package feed thrus 25 (e.g., thru silicon vias) extending up from circuit substrate 14. Exposing of contact pads 22 and package feed thrus 25 allows for electrical coupling of the patterned conformal structure 10 to a ground plane 23 of the circuit substrate 14. In an exemplary embodiment, openings 20 are formed by way of a laser drilling process. That is, a laser is directed to points on dielectric coating above contact pads 22 and package feed thrus 25, so as to drill through (i.e., burn) any dielectric material positioned thereover. It is recognized that the exposing of contact pads 22 also allows for a manufacturer to test the circuit assembly 12 after forming dielectric layer 18.

An electrically conductive layer 24 is formed on top of the dielectric layer 18 after the dielectric layer has been allowed to cure and after formation of openings 20. The electrically conductive layer 24 is comprised of an electrically and thermally conductive material and can be formed of a metallic material such as copper, silver, or nickel, for example, so as to provide localized RF and EM shielding to the circuit assembly 12 and serve as electrical/thermal pathways in the circuit assembly 12. According to an exemplary embodiment, the conductive layer 24 is in the form of a metallic particulate coating that is applied to dielectric layer 18 via a spray application. Alternatively, conductive layer 24 can be applied by way of a sputtering or plating process. While referenced here below as a metallic layer 24, it is also envisioned that other suitable materials could also be used to form the patterned layer, such as a metal impregnated epoxy or metal-filled paint, and it is to be understood that the term patterned metallic layer encompasses such variations and equivalents. It is also envisioned that metallic layer 24 could be formed by deposition of multiple layers (not shown) to provide better adhesion between the metallic layer 24 and dielectric layer 18 (e.g., a titanium layer adjacent to the dielectric layer and a copper layer on the titanium layer formed by a sputtering or plating process) and improved shielding characteristics.

While metallic layer 24 is originally applied as a continuous layer, such as via a spray coating process (or alternatively a sputtering or plating process), the metallic layer 24 is subsequently patterned such that it takes the form of a discontinuous layer, as is shown in FIG. 2. That is, metallic layer 24 is patterned to form localized shielding structures 26 for components 16 of the circuit assembly 12. As shown in FIG. 2, each of the shielding structures 26 is electrically connected to ground by way of either contact pads 22 or package feed thrus 25 in order to provide shielding. The shielding structures 26 can provide a high heat conductivity thermal plane for conductive or convection cooling of the circuit assembly 12, with the contact pads 22 and/or package feed thrus 25 acting as thermal conductors from the circuit substrate 14 or components 16 to the shielding structures 26.

According to embodiments of the invention, the patterning of the metallic layer 24 to form shielding structures 26 is by way of a laser ablation (i.e., laser cutting) process. As shown in FIG. 2, a laser ablation process is performed on dielectric layer 18 and metallic layer 24, such that each of dielectric layer 18 and metallic layer 24 are patterned to include a plurality of overlapping pathway openings 27 (i.e., the pathway is formed vertically down through dielectric layer 18 and metallic layer 24). According to one embodiment of the invention, pathway openings 27 also extend down through solder mask 17, down to circuit substrate 14. It is also envisioned that pathway openings 27 could further be formed to extend down through a portion of the circuit substrate 14.

Referring still to FIG. 2, the laser cut pathway openings 27 in dielectric layer 18 and metallic layer 24 are formed so as to isolate patches of metallic layer 24 from one another, thereby defining localized/isolated shielding structures 26 (i.e., isolated shielding areas/patches) over the circuit components 16 of the circuit assembly 12. Each of the pathway openings 27 has a width sufficient to properly isolate adjacent circuit components 16 and adjacent shielding areas 26 from one another, while being narrow enough to be easily formed between tightly packed circuit components. According to an exemplary embodiment, the pathway openings can thus be laser cut to have a width of approximately 25 to 500 micrometers, for example, although other wider or narrower width pathway openings could also be laser cut based on a placement density of circuit components 16 on substrate 14. Furthermore, it is recognized that each pathway opening 27 can be formed by a single laser cut or be formed by multiple passes of a laser (i.e., multiple laser cuts), based on a desired width of the pathway opening.

In addition to forming shielding structures 26 by way of laser ablation, interconnects 28 can also be formed by way of laser ablation, according to an embodiment of the invention. That is, a laser cutting process can be used to form pathway openings 27 in dielectric layer 18 and metallic layer 24 to define interconnects 28 that are in contact with circuit substrate 14 (and contact pads 22) through openings 20. Interconnects 28 can thus be defined to provide electrical and/or thermal pathways in the circuit assembly 12.

Figure 3A:
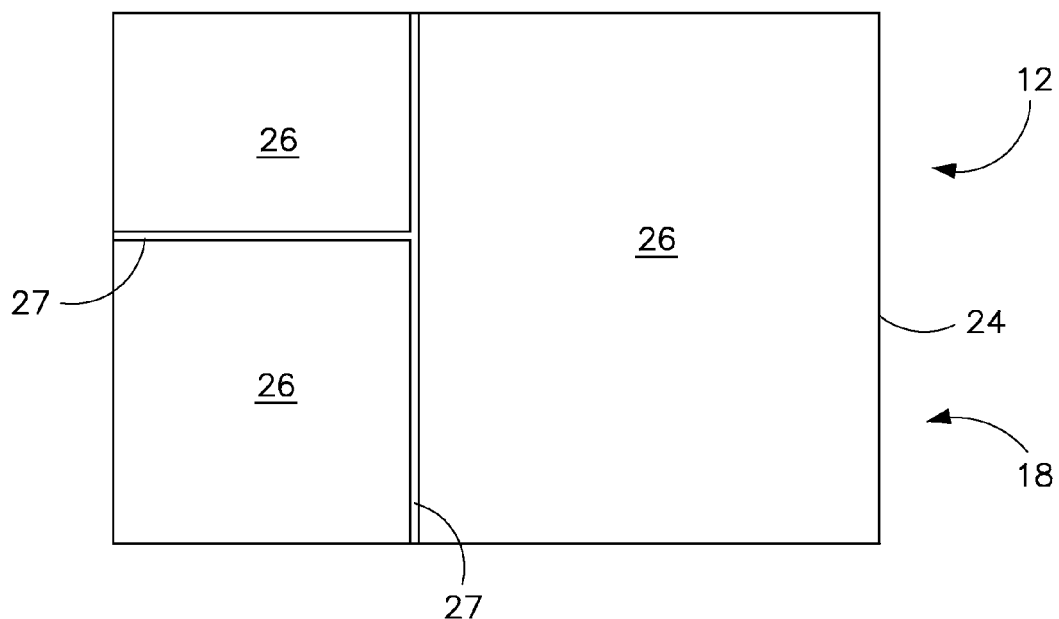
FIG. 3A is a top view of a patterned conformal structure according to an embodiment of the invention.
Figure 3B:
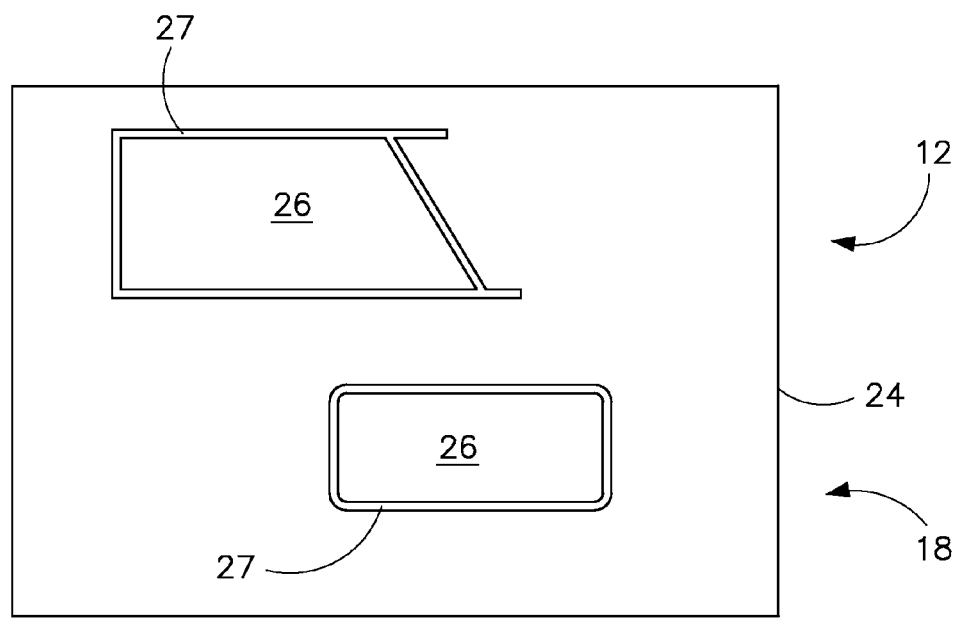
FIG. 3B is a top view of a patterned conformal structure according to another embodiment of the invention.

Referring now to FIGS. 3A and 3B, a top view of circuit assembly 12 is provided. As shown in FIG. 3A, a plurality of laser cut pathway openings 27 are formed in metallic layer 24 and dielectric layer 18 to segregate areas of metallic layer 24 from one another, thereby defining isolated shielding areas 26 over circuit components 16 or groups of circuit components (FIGS. 1 and 2) of the circuit assembly 12. Thus, according to the embodiment shown in FIG. 3A, three distinct shielding areas 26 can be formed, which can be electrically connected to circuit substrate 14 by way of contact pads 22 (FIG. 2), for example. Referring now to FIG. 3B, according to another embodiment of the invention, each of pathway openings 27 is in the form of a closed-loop pathway that encircles a patch of metallic layer 24, thereby defining isolated shielding areas 26 over circuit components 16 or groups of circuit components (FIGS. 1 and 2) of the circuit assembly 12. Isolated shielding areas 26 can be electrically connected to circuit substrate 14 by way of package feed thrus 25 (FIG. 2), for example. In each of the embodiments of FIGS. 3A and 3B, isolation of each of shielding areas 26 by way of pathway openings 27 aids in protecting and shielding each circuit component or group of circuit components from potential interference from other components 16 of the circuit assembly 12, thereby minimizing crosstalk between circuit components.

Figure 4:
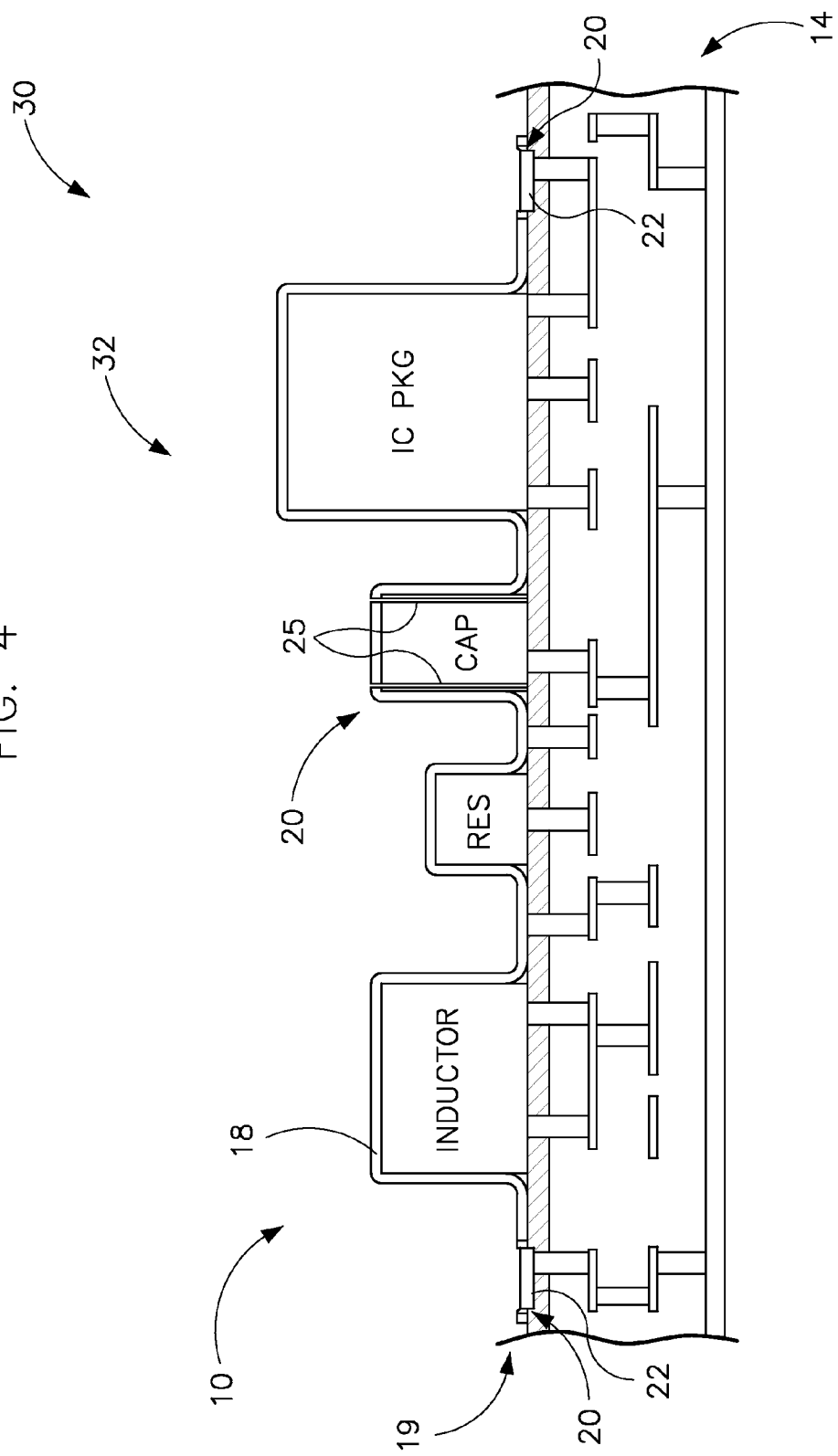
FIGS. 4-6 are cross-sectional views of a patterned conformal structure at various steps of manufacturing according to an embodiment of the invention.
Figure 5:
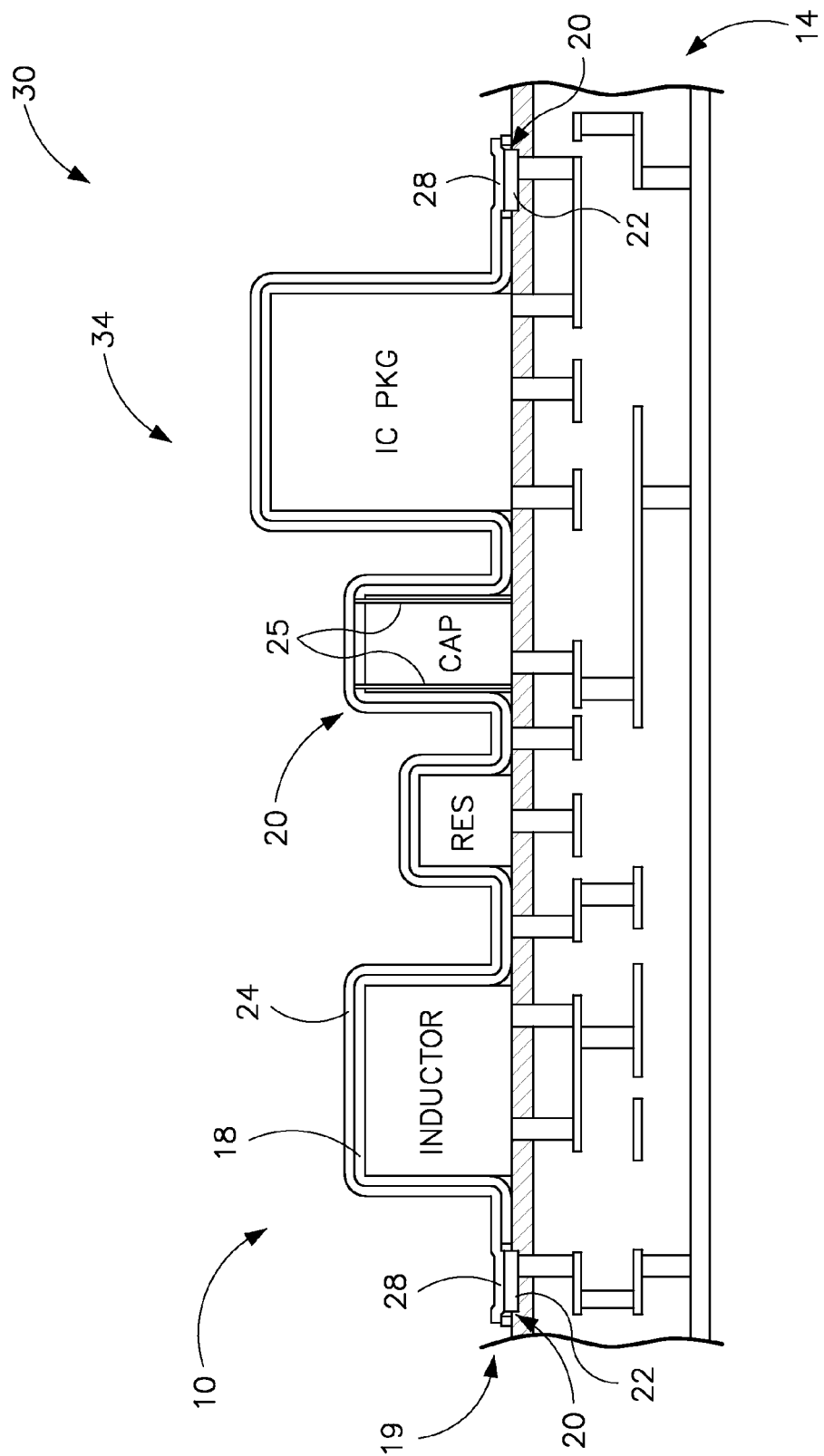
Figure 6:
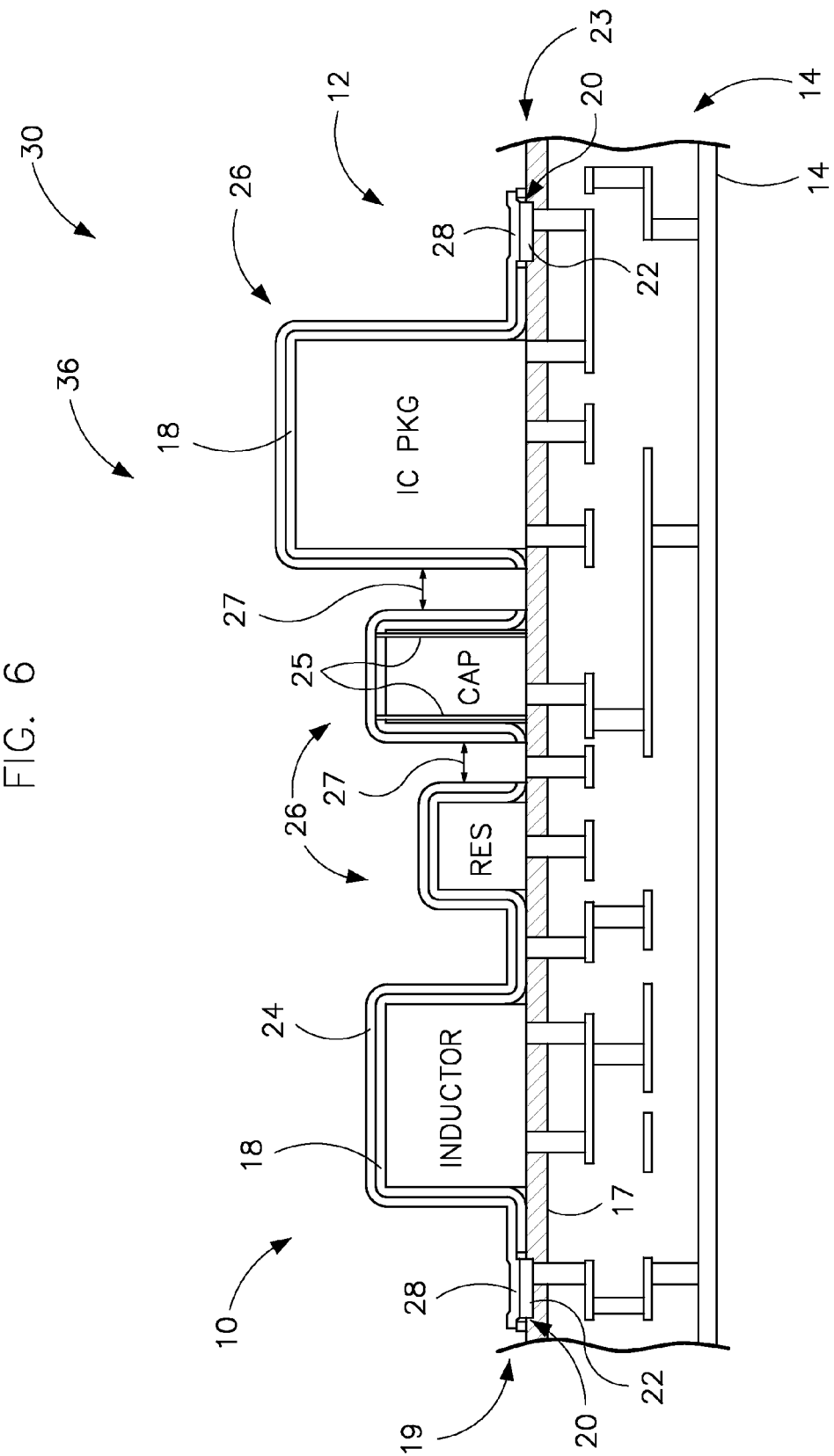

Turning now to FIGS. 4-6, progressive structures are illustrated, made in an exemplary process 30 of fabricating/forming a patterned conformal structure, such as the conformal structure 10 shown in FIGS. 1-3, in accordance with an embodiment of the present invention. As shown in FIG. 4, the process begins at STEP 32 where dielectric layer/coating 18 is applied to circuit substrate 14 and the circuit components 16 (e.g., resistors, integrated circuit packages, capacitors, inductors, etc.) upon which it is disposed. The dielectric layer 18 (i.e., electrically insulating layer) is positioned adjacent to and formed over top surface 19 of circuit substrate 14 and the circuit components 16 positioned thereon and makes contact with the circuit components 16 so as to help protect the components and other portions of the circuitry on the circuit substrate 14 from electrical shorts. The dielectric layer 18 can be formed of any electrically insulating material that can be made to conform to the shape of the circuit assembly 12, and in one embodiment, comprises a ultraviolet (UV) curable polymer such as, for example, a UV light curing conformal coating by Dymax Corp. It is also envisioned, however, that other suitable epoxy coatings or silicon-based coatings could also be used to form dielectric layer 18. In depositing dielectric layer 18 on circuit assembly 12 at STEP 32, a spray coating process can be employed so as to provide a controllable and reproducible depositing of dielectric coating 18 on circuit assembly 12, allowing for control of the thickness of the dielectric layer. It is also envisioned, however, that a dip coating process can be used to deposit dielectric layer 18 on circuit assembly 12, or that dielectric layer 18 could be applied and shaped by way of a thermo-forming process. Importantly, the deposition of dielectric coating 18 on circuit assembly 12 via one of the above techniques results in a coating having a uniform thickness and that is pinhole-free.

Also at STEP 32, openings 20 are formed in dielectric layer 18 to expose contact pads 22 located on circuit substrate 14 and, according to one embodiment, expose package feed thrus 25 that have been formed to extend up from circuit substrate 14 and/or components 16. Exposing of contact pads 22 and package feed thrus 25 allows for electrical coupling of the conformal structure 10 (i.e., metallic layer 24) to a ground plane 23 of the circuit substrate 14, as will be explained in FIGS. 5-6. In an exemplary embodiment, openings 20 are formed at STEP 32 by way of a laser drilling process. That is, a laser is directed to points on dielectric coating above contact pads 22 and package feed thrus 25, so as to drill through (i.e., burn) any dielectric material positioned thereover.

Referring now to FIG. 5, upon formation of openings 20 in dielectric layer 18 and curing thereof, the process 30 continues at STEP 34 where metallic layer 24 is applied to dielectric layer 18 and within openings 20. The metallic layer 24 is comprised of an electrically and thermally conductive material and can be formed of copper, silver, or nickel, or alternatively of a metal impregnated epoxy or metal-filled paint, so as to provide localized RF and EM shielding to the circuit assembly 12 and serve as electrical interconnects and thermal pathways in the circuit assembly 12. According to an exemplary embodiment of the process, metallic layer 24 is applied to dielectric layer 18 via a spray application, and is thus in the form of a metallic particulate coating or paint. Alternatively, it is envisioned that conductive layer 24 can be applied by way of a sputtering or plating process. The metallic layer 24 is applied to dielectric layer 18 such that it has at least a minimal thickness so as to provide uniform and complete metal coverage (e.g., 1-2 kA), and provides adequate RF and EM shielding of circuit assembly 12. While shown in FIG. 5 as being formed as a single layer via a single spray application of a metallic material, it is also recognized that metallic layer 24 could be formed by a two-step process. That is, a thin first metallic layer could be added via a spray application as set forth above, and then a second metallic layer can be to the first metallic layer via another spray application to increase the thickness of the overall metallic layer 24, thus providing improved shielding in conformal structure 10.

In addition to being deposited over dielectric layer 18, metallic layer 24 is also deposited in openings 20 so as to form an electrical connection with contact pads 22 (and package feed thrus 25). This electrical connection between metallic layer 24 and contact pads 22/package feed thrus 25 provides for coupling of the patterned conformal structure 10 to the circuit substrate 14 and provides enhanced shielding to reduce RF emissions entering or leaving protected areas.

Referring now to FIG. 6, in a next step of process 30, dielectric layer 18 and metallic layer 24 are patterned at STEP 36. More specifically, dielectric layer 18 and metallic layer 24 are laser ablated or laser cut at STEP 36 to form a plurality of pathway openings 27 therethrough that extend down (through solder mask 17) to circuit substrate 14. The laser cut pathway openings 27 in dielectric layer 18 and metallic layer 24 are formed so as to isolate patches of metallic layer 24 from one another, thereby defining isolated shielding areas 26 over the circuit components 16 of the circuit assembly 12. According to an embodiment of the invention, each of the pathway openings can be laser cut to have a width of approximately 25 to 500 micrometers. It is recognized that STEP 36 can encompass a single laser cutting step to form each pathway opening 27 or can encompass multiple laser cutting steps (i.e., multiple passes of a laser) to form each pathway opening 27. The formation of each pathway opening 27 in single or multiple steps can be based on design requirements of the circuit assembly 12, such as a desired distance between adjacent elements of metallic layer 24 for controlling cross-talk, etc. According to an embodiment of the invention, additional laser cutting of metallic layer 24 can be performed at STEP 36 so as to form interconnects 28 or areas that provide electrical routing and/or thermal pathways in the circuit assembly 12.

Upon completion of STEP 36, the resulting patterned metallic layer 24 is thus in the form of a discontinuous layer, and can include therein shield portions 26 (i.e., shielding areas) and electrical/thermal pathways or interconnects 28. Beneficially, the selective formation of shield portions 26 allows for isolated faraday cages to be formed about components 16 (or groups of components) on the circuit substrate 14. Additionally, formation of interconnects 28 that act as thermal conductors provides for structures separate from shielding areas 26 that can function as a high heat conductivity thermal plane for additional conductive or convection cooling of the circuit assembly 12

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

Therefore, according to one embodiment of the invention, a conformal structure includes a dielectric coating positioned on an electrical system having circuit components mounted thereon, the dielectric coating shaped to conform to a surface of the electrical system and having a plurality of openings therein positioned over contact pads on the surface of the electrical system. The conformal structure also includes a conductive coating layered on the dielectric coating and on the contact pads such that an electrical connection is formed between the conductive coating and the contact pads. The dielectric coating and the conductive coating have a plurality of overlapping pathway openings formed therethrough to isolate a respective shielding area of the conformal structure over desired circuit components or groups of circuit components.

According to another embodiment of the invention, a method of forming a patterned conformal structure includes the step of applying a conformal insulating coating to an electrical system, the electrical system including a circuit substrate and a plurality of circuit components mounted thereon. The method also includes the steps of depositing a conformal metallic layer on the insulating coating and laser ablating a plurality of pathway openings through the insulating coating and the metallic layer to segregate the conformal insulating coating and metallic layer into isolated shielding areas positioned over desired circuit components or groups of circuit components.

According to yet another embodiment of the invention, a method of forming a patterned conformal structure includes the steps of applying an electrically insulating coating to a circuit board having a plurality of circuit components mounted thereon and forming a contact pad opening in the electrically insulating coating adjacent to each of a plurality of contact pads on the circuit board. The method also includes the steps of depositing a conductive layer over the electrically insulating coating and in the contact pad opening adjacent to each of the plurality of contact pads and laser ablating the conductive layer and the electrically insulating coating to form an isolated conductive layer shielding area over each of a plurality of selected circuit components or group of circuit components.

What is claimed as new and desired to be protected by Letters Patent of the United States is:

What is claimed is:
1. A conformal structure comprising:
   a dielectric coating positioned on an electrical system having circuit components mounted thereon, the dielectric coating shaped to conform to a surface of the electrical system and having a plurality of openings therein positioned over contact pads on the surface of the electrical system; and a conductive coating layered on the dielectric coating and on the contact pads such that an electrical connection is formed between the conductive coating and the contact pads;

wherein the dielectric coating and the conductive coating have a plurality of overlapping pathway openings formed therethrough to isolate a respective shielding area of the conformal structure over desired circuit components or groups of circuit components.

2. The conformal structure of claim 1 wherein the respective shielding area over each of the circuit components comprises an isolated patch of the dielectric coating and the conductive coating over the circuit component.

3. The conformal structure of claim 1 wherein each of the plurality of overlapping pathway openings comprises a closed-loop pathway that encircles its respective shielding area.

4. The conformal structure of claim 1 wherein the conductive coating comprises one of a particulate metallic spray coating, a sputtered metallic coating, and a plated metallic coating.

5. The conformal structure of claim 1 wherein each of the plurality of overlapping pathway openings has a width of between approximately 25 and 500 micrometers.

6. The conformal structure of claim 1 wherein the plurality of overlapping pathway openings comprise laser cut pathway openings.

7. The conformal structure of claim 1 further comprising a solder layer positioned between the dielectric coating and the surface of the electrical system, and wherein the solder layer includes a plurality of pathway openings formed therethrough that overlap the plurality of overlapping pathway openings in the dielectric and conductive coatings.

8. The conformal structure of claim 1 wherein the electrical system comprises one of a printed circuit board (PCB), a flex PCB, a rigid flex PCB, and a module.

9. The conformal structure of claim 1 further comprising package feed thrus extending from the electrical system to each of the isolated shielding areas, thereby electrically grounding the isolated shielding areas to the electrical system.

10. The conformal structure of claim 1 wherein the conductive coating comprises:

a first metallic coating layered on the dielectric coating and in the plurality of openings such that an electrical connection is formed between the first metallic coating and the contact pads; and a second metallic coating layered on the first metallic coating.

11. A method of forming a patterned conformal structure, comprising:

applying a conformal insulating coating to an electrical system, the electrical system including a circuit substrate and a plurality of circuit components mounted thereon;

depositing a conformal metallic layer on the insulating coating; and laser ablating a plurality of pathway openings through the insulating coating and the metallic layer to segregate the conformal insulating coating and metallic layer into isolated shielding areas positioned over desired circuit components or groups of circuit components.

12. The method of claim 11 wherein depositing the conformal metallic layer comprises one of spray coating, sputtering, and plating the conformal metallic layer on the insulating coating to form a continuous metallic layer.

13. The method of claim 11 wherein laser ablating the pathway openings through the insulating coating and the metallic layer comprises laser cutting pathway openings having a width of between approximately 25 and 500 micrometers.

14. The method of claim 11 further comprising:

forming a plurality of contact pad openings in the insulating coating at desired locations; and depositing the conformal metallic layer in each of the plurality of contact pad openings, the metallic layer being electrically connected with the electrical system at the desired locations.

15. The method of claim 11 further comprising forming package feed thrus between the electrical system and an isolated shielding area to electrically ground the isolated shielding area with the electrical system.

16. The method of claim 15 further comprising forming a plurality of via openings in the insulating coating at locations corresponding to the package feed thrus.

17. The method of claim 11 wherein laser ablating the plurality of pathway openings comprises laser ablating through a portion of the circuit substrate.

18. The method of claim 11 wherein depositing the conformal metallic layer comprises:

depositing a first metallic layer over the insulating coating; and depositing a second metallic layer onto the first metallic layer.

19. A method of forming a patterned conformal structure, comprising:

applying an electrically insulating coating to a circuit board, the circuit board having a plurality of circuit components mounted thereon;

forming a contact pad opening in the electrically insulating coating adjacent to each of a plurality of contact pads on the circuit board;

depositing a conductive layer over the electrically insulating coating and in the contact pad opening adjacent to each of the plurality of contact pads; and laser ablating the conductive layer and the electrically insulating coating to form an isolated conductive layer shielding area over each of a plurality of selected circuit components or group of circuit components.

20. The method of claim 19 wherein laser ablating the conductive layer and the electrically insulating coating comprises laser cutting a plurality of pathways into the conductive layer and into the electrically insulating coating.

21. The method of claim 20 wherein laser cutting each of the plurality of pathways comprises laser cutting a closed-loop pathway that defines an isolated conductive layer shielding area.

22. The method of claim 20 wherein laser cutting the plurality of pathways comprises laser cutting pathways into the conductive layer to segregate the conductive layer into distinct shielding areas.

23. The method of claim 20 wherein each of the plurality of pathways has a width of approximately 25 to 500 micrometers.

24. The method of claim 19 wherein depositing the conductive layer comprises spray coating a particulate metallic layer on the electrically insulating coating.

25. The method of claim 19 wherein depositing the conductive layer comprises:
   depositing a first metallic layer over the electrically insulating coating and in each of the contact pad openings; and
   depositing a second metallic layer onto the first metallic layer.

* * * * *